United States Patent
Chu et al.

(10) Patent No.: US 7,432,980 B2
(45) Date of Patent: Oct. 7, 2008

(54) METHOD FOR REDUCING ANALOG PLL JITTER IN VIDEO APPLICATION

(75) Inventors: Cyrus Chu, Fremont, CA (US); Wen Yi Huang, Donggang Township, Pingtung County (TW)

(73) Assignee: Terawins, Inc., Zhong-He (TW)

( * ) Notice: Subject to any disclaimer, the term of this patent is extended or adjusted under 35 U.S.C. 154(b) by 551 days.

(21) Appl. No.: 11/197,447

(22) Filed: Aug. 5, 2005

(65) Prior Publication Data

US 2007/0030388 A1 Feb. 8, 2007

(51) Int. Cl.
  *H04N 9/455* (2006.01)
  *H04N 9/45* (2006.01)
(52) U.S. Cl. .................. 348/536; 348/540; 348/547

(58) Field of Classification Search .......... 348/536, 348/537, 540, 547, 505, 506, 497; 375/371, 375/373, 376; 331/1 A, 25, 20; *H04N 9/455, H04N 9/45*
See application file for complete search history.

(56) References Cited

U.S. PATENT DOCUMENTS

| 6,768,385 B2 * | 7/2004 | Smith | 331/1 A |
| 7,015,973 B2 * | 3/2006 | Kim | 348/536 |

* cited by examiner

*Primary Examiner*—Sherrie Hsia
(74) *Attorney, Agent, or Firm*—Bacon & Thomas, PLLC

(57) ABSTRACT

The present invention provides a method for reducing analog PLL (Phase-lock loop) jitter in video ADC application. The HSync/CSync is replaced with a faked HSync signal to be inputted to PLL during vertical blank period. Therefore the analog PLL will only see the faked HSync signal of fixed period as a line-lock trigger signal, while no COAST signal is required. Also, the faked HSync is fine-tuned to match with the external HSync/CSync leading edge to minimize PLL jitter.

5 Claims, 7 Drawing Sheets

METHOD FOR REDUCING ANALOG PLL JITTER IN VIDEO APPLICATION

FIELD OF THE INVENTION

The present invention relates to analog video application, and more particularly to method for reducing analog PLL (Phase-lock loop) jitter in video application.

BACKGROUND OF THE INVENTION

Analog video signal application is still popular everywhere, and using a line-lock analog PLL (Phase-lock loop) for tracking line period (H-Sync period) to recover data clock with low jitter is very important to capture the analog video.

Conventional method is to use HSync, either input from RGB video stream or from the voltage sliced CSync (Composite Sync, from YPbPr component video) to feed into the analog PLL, and use vertical blank period as the PLL COAST signal to maintain PLL speed.

However, the HSync or CSync do not maintain the same period during vertical blank. Even with the help from the COAST signal, the clock generated by the analog PLL still will decay slightly and/or accumulate.

The present invention has arisen to mitigate and/or obviate the afore-described disadvantages.

SUMMARY OF THE INVENTION

The primary objective of the present invention is to replace the HSync/CSync with faked HSync to PLL during vertical blank period. Therefore the analog PLL will only see the fixed period HSync as line-lock trigger signal, while no COAST signal is required. Also, the faked HSync is fine-tuned to match with the external HSync/CSync leading edge to minimize PLL jitter.

The present invention will become more obvious from the following description when taken in connection with the accompanying drawings, which show, for purpose of illustrations only, the preferred embodiment in accordance with the present invention.

DETAILED DESCRIPTION OF THE PREFERRED EMBODIMENT

What is Line-Locked PLL?

Analog Video inputs do not have data clock coming with their video data. But they do have Sync information to inform the Video capture/display device when the video image is changing line or changing field as well.

Some types of sync information are as below:
1. Separated sync RGB input: it has VSync and HSync both.
2. Composite Sync RGB input: it has CSync only, which combines VSync into HSync signal.
3. Sync_On_Green RGB input or YC separated Video (Sync Tip on Luminance channel): it needs a voltage slicing to separate sync tips from analog video signal, and then generate a CSync signal.

How does Line-Locked PLL Work and Jitter?

Line-Locked analog PLL tracks the period trigger signal, such as HSync, and be programmed with a divisor such that for every one HSync trigger, the PLL will generate as many clocks as the divisor.

As long as the HSync keeps exactly the same period, the analog PLL will generate accurate clocks with no jitter.

However, the HSync can not keep exactly the same period, the issues are:
1. HSync edge may vary a little due to IC pad sampling, especially when the HSync signal rises/falls slowly. Even with the Schmitt Trigger pad, the improvement is limited.
2. When in non-separated sync mode, the HSync in the CSync may be disappeared or double frequency or shift around VSync, and Some PLLs do not have COAST function.
3. Even most of the Analog PLLs have COAST function, but HSync still decay a little during COAST period.

The present invention has arisen to solve the second and the third issues.

Sync and Clock Block Diagram

Figure 1:
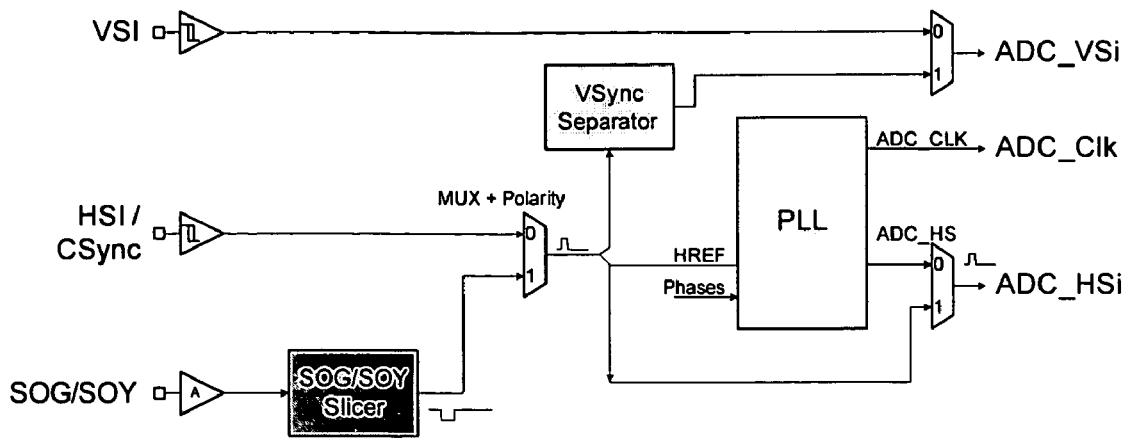
FIG. 1 shows a block diagram of prior art ADC clock generating, in which the PLL has no COAST function.
Figure 2:
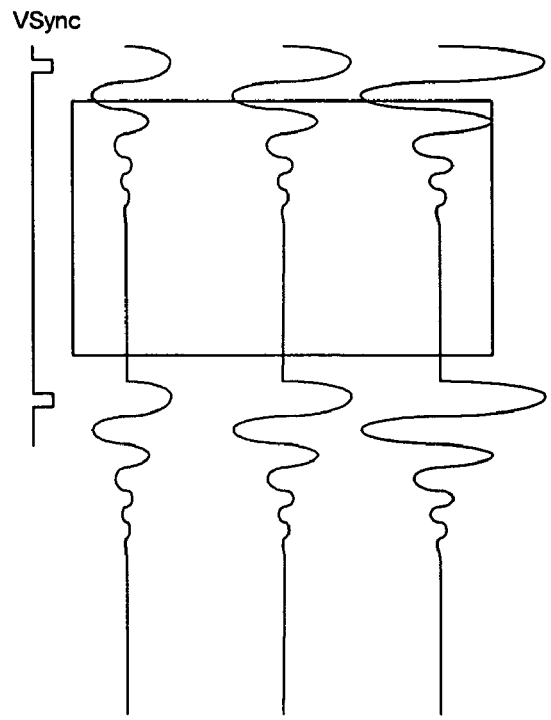
FIG. 2 shows a graphic distortion result of the PLL in FIG. 1.

Some analog PLLs do not have COAST function. FIG. 1 shows a block diagram of prior art ADC clock generating, in which the PLL has no COAST function. Such PLL is unable to support CSync (Composite Sync.) due to it is too slow in recovering PLL clock after Vertical Blank period. A graphic distortion result is shown in FIG. 2.

Figure 3:
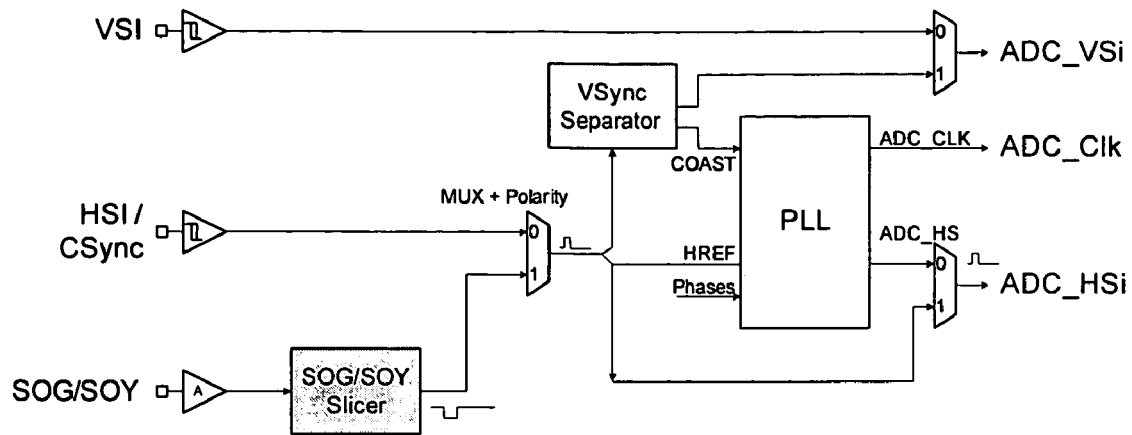
FIG. 3 shows a block diagram of prior art ADC clock generating, in which the PLL has the COAST function.
Figure 4:
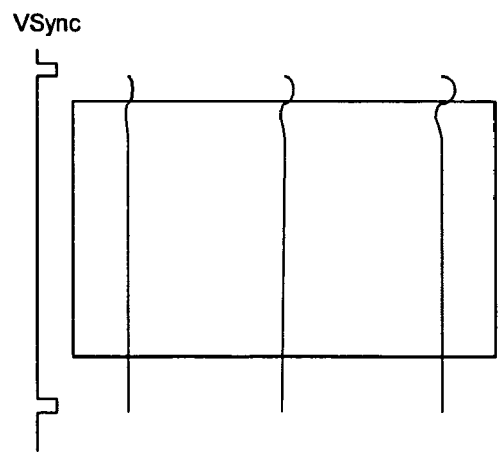
FIG. 4 shows a graphic distortion result of the PLL in FIG. 3.

Some other PLLs do have COAST function, as shown in FIG. 3. Such PLLs, if it is recovered fast, then there is no problem. But if PLL decays clocks soon and is recovered slowly, then it will have a little distortion as shown in FIG. 4.

Figure 5:
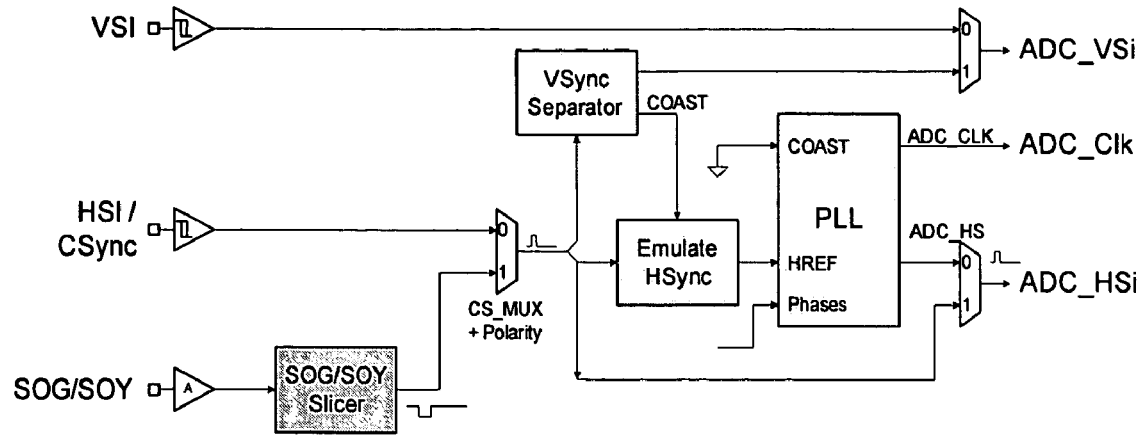
FIG. 5 shows a block diagram of ADC clock generating in PLL in accordance with the present invention.
Figure 6:
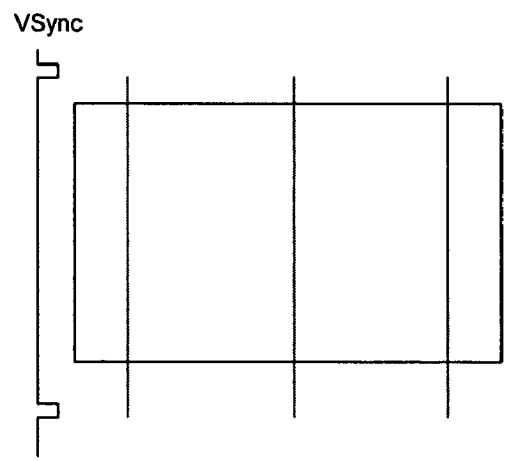
FIG. 6 shows a graphic result of the PLL in FIG. 5.

The present invention is shown in FIG. 5, in which an "Emulate HSync" block is added. Besides generating a faked HSync for non-COAST PLLs, the invention also has a fine-tune mechanism to reduce HSync period variation. And the image does not have distortion as shown in FIG. 6.

VSync Separation

The purpose of VSync Separation is to extract the VSync and generate COAST from the CSync signal.

Figure 7:
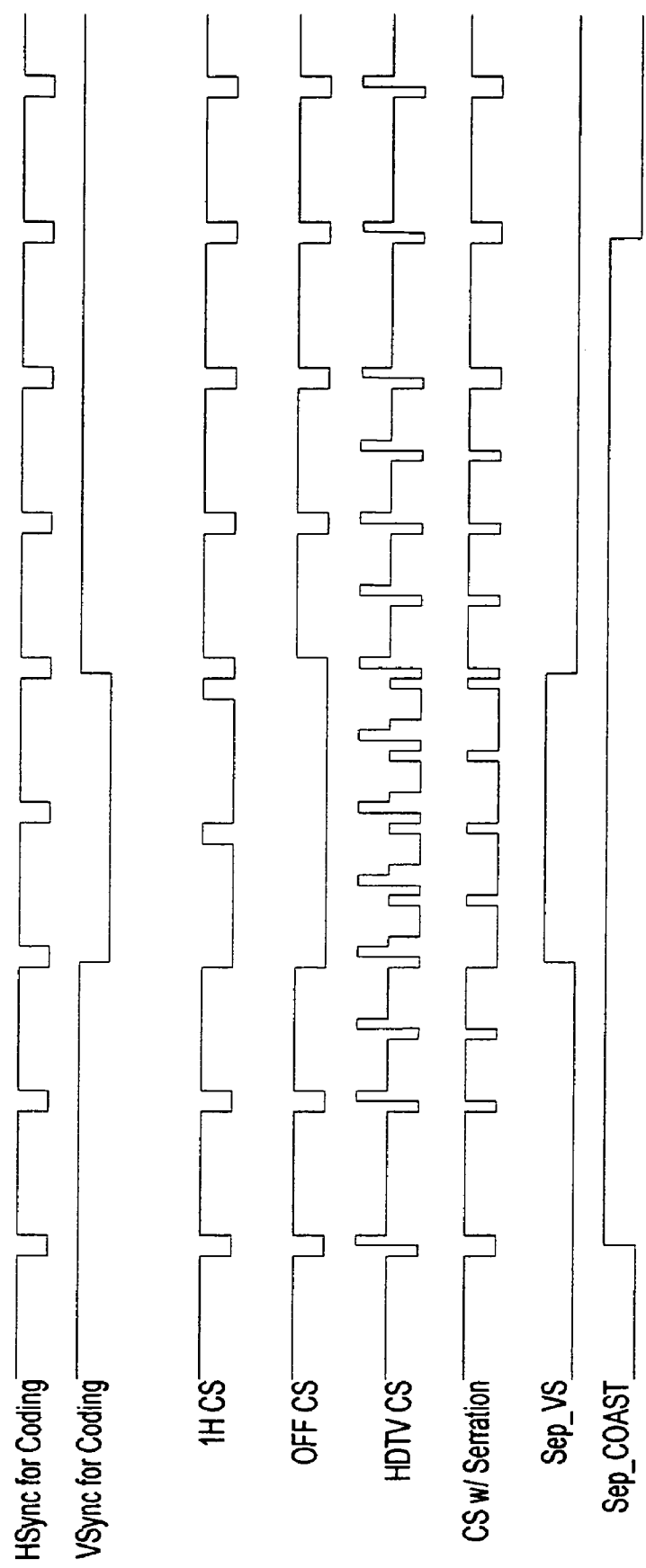
FIG. 7 shows some types of CSync, separated VSync and a generated COAST.

Referring to FIG. 7, some types of CSync, separated VSync and a generated COAST are shown.

The extracted VSync is for timing measurement or for informing the display device a video filed change, and the extracted COAST can be used in PLL if it has COAST function to keep maintain the same PLL output speed.

But some analog PLLs do not have COAST function, it will cost a lot of time to vibrate clock back to normal clock speed or even unable to recover back since it is disturbed by the vertical blank of CSync. Therefore the present invention is to generate a faked HSync to replace the CSync during COAST period.

Generation of Faked HSync and Emulate_HSync

The present invention is to use clock counters (PLL_Clk in FIG. 5) to track the High/Low width of CSync during non- COAST period, and therefore an HSync similar signal (Fake_HSync) can be periodically generated to keep stimulating PLL in COAST period. The Fake_HSync has exactly the same clock numbers as the original normal HSync (or CSync), when CSync is in non-COAST period.

Firstly, referring to FIG. 5, the CSync trailing edge is used to re-synchronize the COAST from VSync_Separator to produce a Fake_HSync_Select signal.

Figure 8:
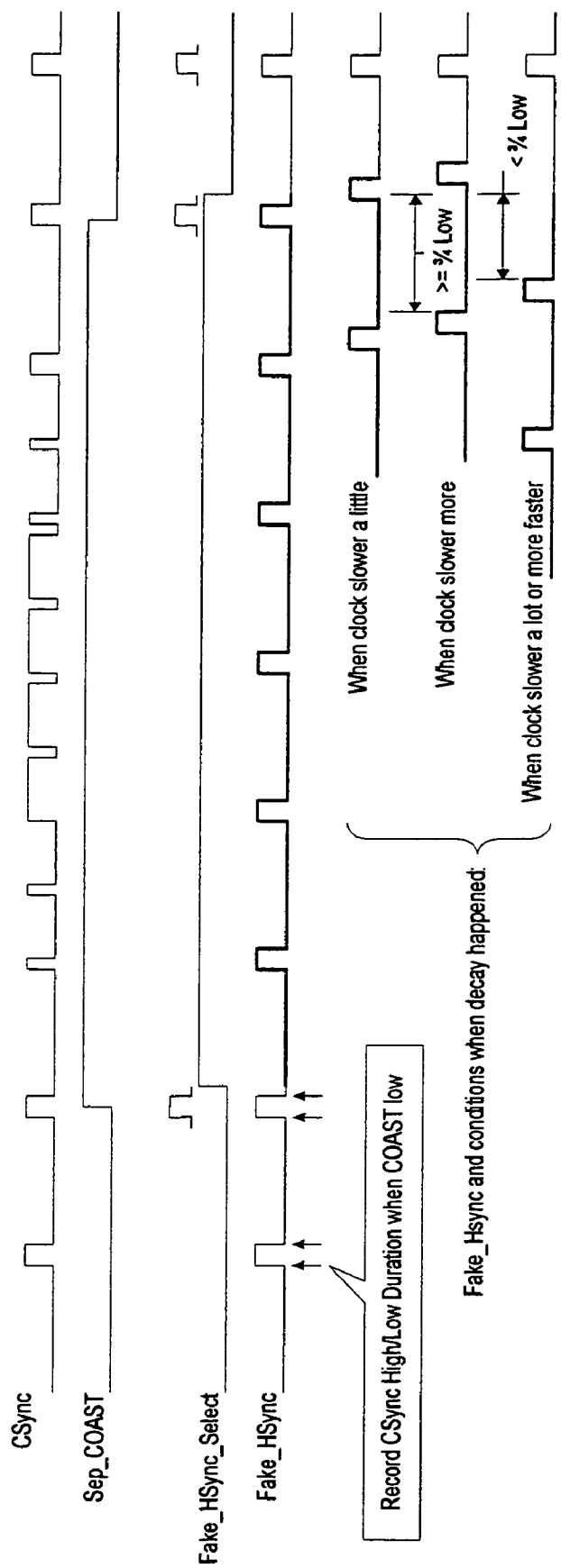
FIG. 8 shows the last Fake_HSync is monitored in accordance with the present invention.

Secondly, even it has the same counter values for tracking, but the Fake_HSync still relies on the PLL_Clk that is outputted by PLL. Once the PLL decay, it still will affect the Fake_HSync to shift a little. So we cannot guarantee the last Faked HSync pulse will match with the external CSync or not when the end of the COAST period is existed (as shown in FIG. 8). So, a compensative logic is required to let the COAST exit sequence smoothly. This can be achieved by monitoring the last Fake_HSync. Referring to FIG. 8, when the last Fake_HSync is slower a little (for example slower below ¼ period), then generating the next HSync pulse as predicted; when the last Fake_HSync is slower too much (for example slower more than ¼ period), then the last Fake_HSync is omitted.

Fine Tune of the Faked HSync

Some PLLs have build-in COAST function. It supposes to have internal re-trigger pulse which works as Fake_HSync during COAST is enabled. However, during COAST active, the PLL ignore any CSync signal. This will cause PLL slightly decay, and has bigger phase jitter. Based on the above Fake_HSync, we have another method to fine tune it for reducing jitter.

The method is performed when generating next Fake_HSync pulse, we have −1T and +1T clock window (where T means clock period) to monitor whether the external CSync has leading edge transition? If no, then just do the same way to generate next faked HSync pulse. If yes, then depends on which window (−1T) or (+1T), to adjust next Fake_HSync counter by +1 clock period or −1 clock period, after that return to same period.

Figure 9:
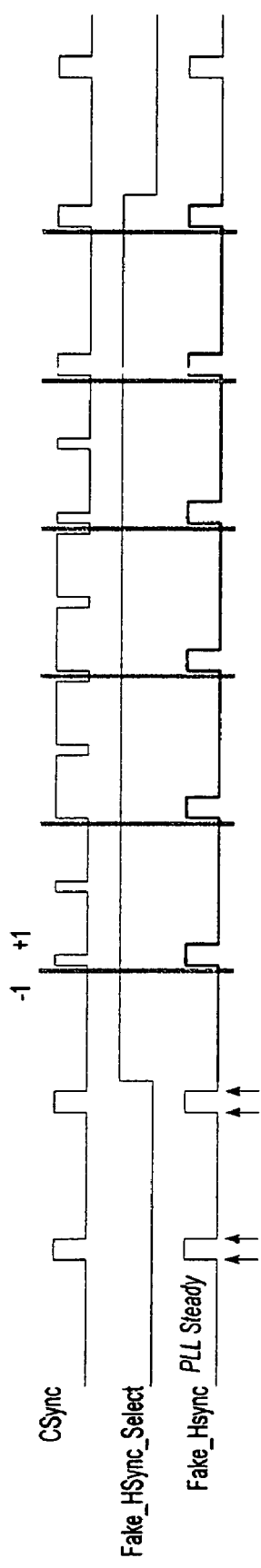
FIGS. 9, 10, 11 show how the Fake_HSync is fine-tuned.

In FIG. 9, when clock decays very very little, the drawing shows no fine tune is required due to the jitter is too small to affect PLL operation.

Figure 10:
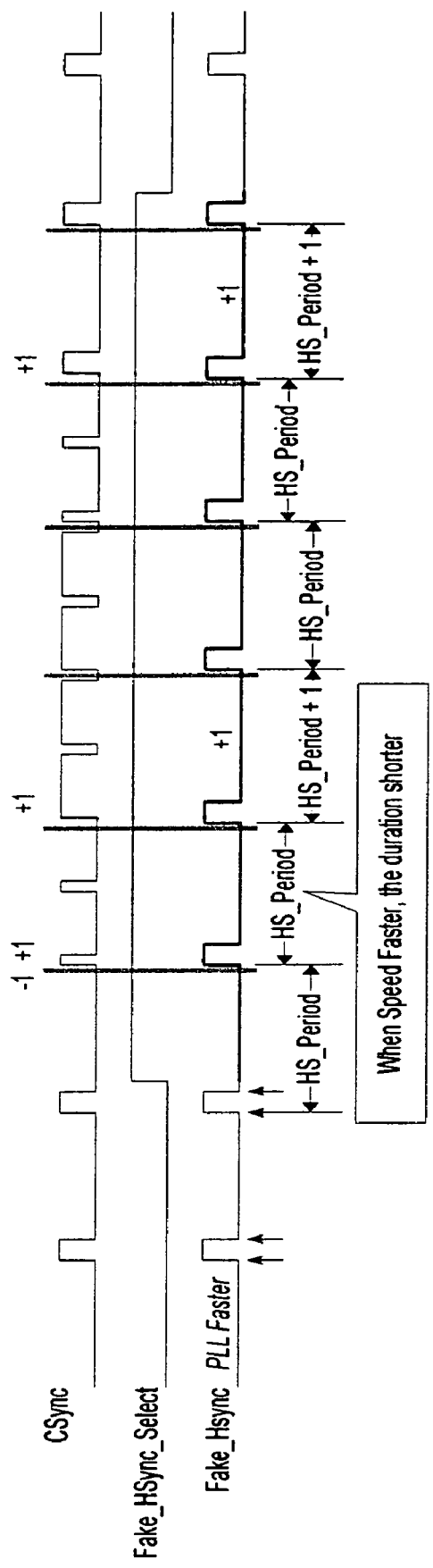
Figure 11:
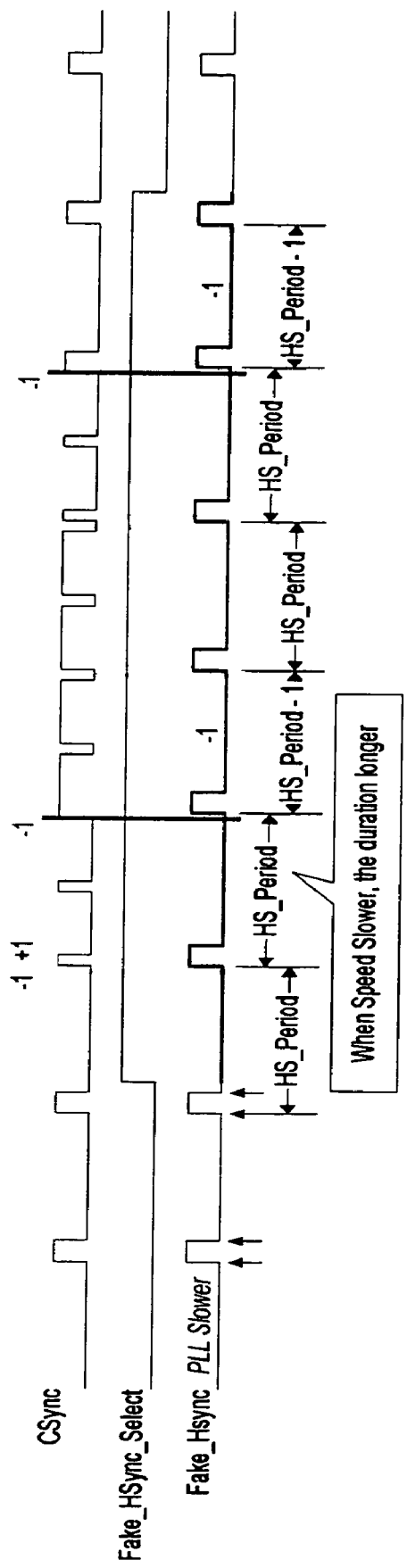

In FIG. 10, when clock is faster a little, the drawing shows that the clock will be decreased by 1T (1 clock period). In FIG. 11, when clock is slower a little, the drawing shows that the clock will be increased by 1T (1 clock period).

While we have shown and described various embodiments in accordance with the present invention, it should be clear to those skilled in the art that further embodiments may be made without departing from the scope of the present invention.

What is claimed is:

1. A method for reducing analog PLL (Phase-lock loop) jitter in a video application that uses a PLL, a VSync Separator and an SOG/SOY slicer, the method comprising steps of:

in an Emulate HSync function, accepting a video signal, a COAST signal from the VSync Separator and a PLL_CLK signal from the PLL, and generating a series of faked HSync signals Fake_HSync to be inputted to the PLL during a COAST period.

2. The method according to claim 1, wherein the PLL_Clk signal is used to track High/Low width of a Csync signal in the video signal during non-COAST period, so as to generate periodically the Fake_HSyne signal similar to a HSync signal in the video signal to keep stimulating PLL during the COAST period.

3. The method according to claim 2, wherein the signal Fake_HSync is monitored by a −1T clock window and a +1T clock window (where T means clock period) to see whether the external CSync has leading edge transition;

if no leading edge transition then generate a next Fake_HSync in the same way; and if the leading edge transition is detected then adjust the next Fake_HSync by +1 clock period or −1 clock period according to which window (−1T or +1T) contains the leading edge transition, and then return to the original period.

4. The method according to claim 1, wherein a last Fake_HSync is monitored, and when the last Fake_HSync is slower below a predetermined fraction of a period, then generating the next HSync pulse as predicted; when the last Fake_HSync is slower more than the predetermined fraction of a period, then the last Fake_HSync is omitted.

5. The method according to claim 4, wherein the predetermined fraction of a period is ¼ period.

* * * * *